(12) United States Patent
Nishiyama et al.

(10) Patent No.: US 9,844,170 B2
(45) Date of Patent: Dec. 12, 2017

(54) COMPONENT MOUNTING MACHINE

(75) Inventors: Satoru Nishiyama, Chiryu (JP); Takehito Okada, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 612 days.

(21) Appl. No.: 14/378,830

(22) PCT Filed: Feb. 28, 2012

(86) PCT No.: PCT/JP2012/054998
§ 371 (c)(1),
(2), (4) Date: Aug. 14, 2014

(87) PCT Pub. No.: WO2013/128584
PCT Pub. Date: Sep. 6, 2013

(65) Prior Publication Data
US 2015/0040384 A1    Feb. 12, 2015

(51) Int. Cl.
*H05K 13/02*        (2006.01)
*H05K 13/04*        (2006.01)

(52) U.S. Cl.
CPC ......... *H05K 13/04* (2013.01); *H05K 13/0413* (2013.01); *Y10T 29/53174* (2015.01)

(58) Field of Classification Search
CPC ............... H05K 13/0408; H05K 13/08; H05K 13/0404; Y10T 29/53174–29/53183
(Continued)

(56) References Cited

U.S. PATENT DOCUMENTS 5,377,405 A * 1/1995 Sakurai ............. H05K 13/0413
                                                        29/740
5,661,239 A * 8/1997 Takeuchi ........... H05K 13/0452
                                                        29/743
(Continued)

FOREIGN PATENT DOCUMENTS

EP   1 617 717 A1   1/2006
JP   2004 6512      1/2004
(Continued)

OTHER PUBLICATIONS

Office Action dated May 28, 2015 in Japanese Patent Application No. 2014-501888 (with English language translation).
(Continued)

*Primary Examiner* — Peter DungBa Vo
*Assistant Examiner* — Kaying Kue
(74) *Attorney, Agent, or Firm* — Oblon, McClelland, Maier & Neustadt, L.L.P.

(57) ABSTRACT

When a mounting head is moved upward of a rear side conveyor across and over a front side conveyor after a component suction operation, it is determined whether or not there is a possibility that a component sucked by a suction nozzle may interfere with a component mounted on a circuit board on the front side conveyor. When so determined, a head lifting mechanism is caused to lift up the mounting head to a position where the component sucked by the suction nozzle does not interfere with the mounted component. Thereafter, the mounting head is moved upward of the rear side conveyor, and the head lifting mechanism is caused to lower down the mounting head to an initial height position. Thereafter, the component is mounted on a circuit board on the rear side conveyor.

8 Claims, 8 Drawing Sheets

(58) Field of Classification Search
USPC .......................................... 29/743, 739–741
See application file for complete search history.

(56) References Cited

U.S. PATENT DOCUMENTS

| | | | | |
|---|---|---|---|---|
| 5,926,950 A * | 7/1999 | Asai | .................... | H05K 13/0413 29/740 |
| 6,073,342 A * | 6/2000 | Asai | .................... | H05K 13/0061 198/586 |
| 6,131,276 A * | 10/2000 | Hirotani | ............. | H05K 13/0408 29/739 |
| 6,230,393 B1 * | 5/2001 | Hirano | ................... | H05K 13/04 29/406 |
| 6,374,484 B1 * | 4/2002 | Yoshida | ............. | H05K 13/0452 29/740 |
| 6,494,671 B1 * | 12/2002 | Takaiti | ................. | H05K 13/021 414/396 |
| 6,594,887 B1 * | 7/2003 | Okuda | ............... | H05K 13/0452 29/739 |
| 6,681,468 B1 * | 1/2004 | Uchiyama | .......... | H05K 13/0015 29/407.01 |
| 6,931,716 B2 * | 8/2005 | Suhara | ................... | H05K 13/08 29/720 |
| 7,036,215 B2 * | 5/2006 | Kodama | ............ | H05K 13/0069 29/740 |
| 7,050,623 B1 * | 5/2006 | Fukuda | ................. | H05K 13/08 29/740 |
| 7,337,533 B2 * | 3/2008 | Imafuku | ............ | H05K 13/0413 29/739 |
| 7,353,589 B2 * | 4/2008 | Kawasumi | ......... | H05K 13/0408 29/720 |
| 7,488,283 B2 * | 2/2009 | Yasui | ................ | H05K 13/0408 29/743 |
| 7,899,561 B2 * | 3/2011 | Maenishi | ............... | H05K 13/08 29/743 |
| 8,782,875 B2 * | 7/2014 | Kawase | ............. | H05K 13/0061 198/340 |
| 2004/0139602 A1 * | 7/2004 | Saho | .................. | H05K 13/0452 29/832 |
| 2005/0071990 A1 * | 4/2005 | Nakamura | ........... | B41J 2/14024 29/740 |
| 2006/0053624 A1 * | 3/2006 | Maeda | ............... | H05K 13/0408 29/832 |
| 2006/0200973 A1 * | 9/2006 | Imafuku | ............ | H05K 13/0413 29/739 |
| 2007/0214629 A1 * | 9/2007 | Imafuku | ............ | H05K 13/0413 29/434 |
| 2007/0277369 A1 * | 12/2007 | Kawazoe | ........... | H05K 13/0061 29/729 |
| 2009/0183361 A1 | 7/2009 | Takahira et al. | | |
| 2011/0302776 A1 | 12/2011 | Kato et al. | | |
| 2012/0272511 A1 * | 11/2012 | Kawase | ............. | H05K 13/0061 29/592.1 |

FOREIGN PATENT DOCUMENTS

| | | |
|---|---|---|
| JP | 2004 343029 | 12/2004 |
| JP | 2008 227249 | 9/2008 |
| JP | 2008 311476 | 12/2008 |
| JP | 2009 170830 | 7/2009 |
| JP | 2011 100955 | 5/2011 |
| JP | 2011 146560 | 7/2011 |

OTHER PUBLICATIONS

International Search Report dated Apr. 3, 3012 in PCT/JP12/054998 Filed Feb. 28, 2012.
Extended European Search Report dated Sep. 18, 2015 in Patent Application No. 12869787.7.

* cited by examiner

[Fig.1]
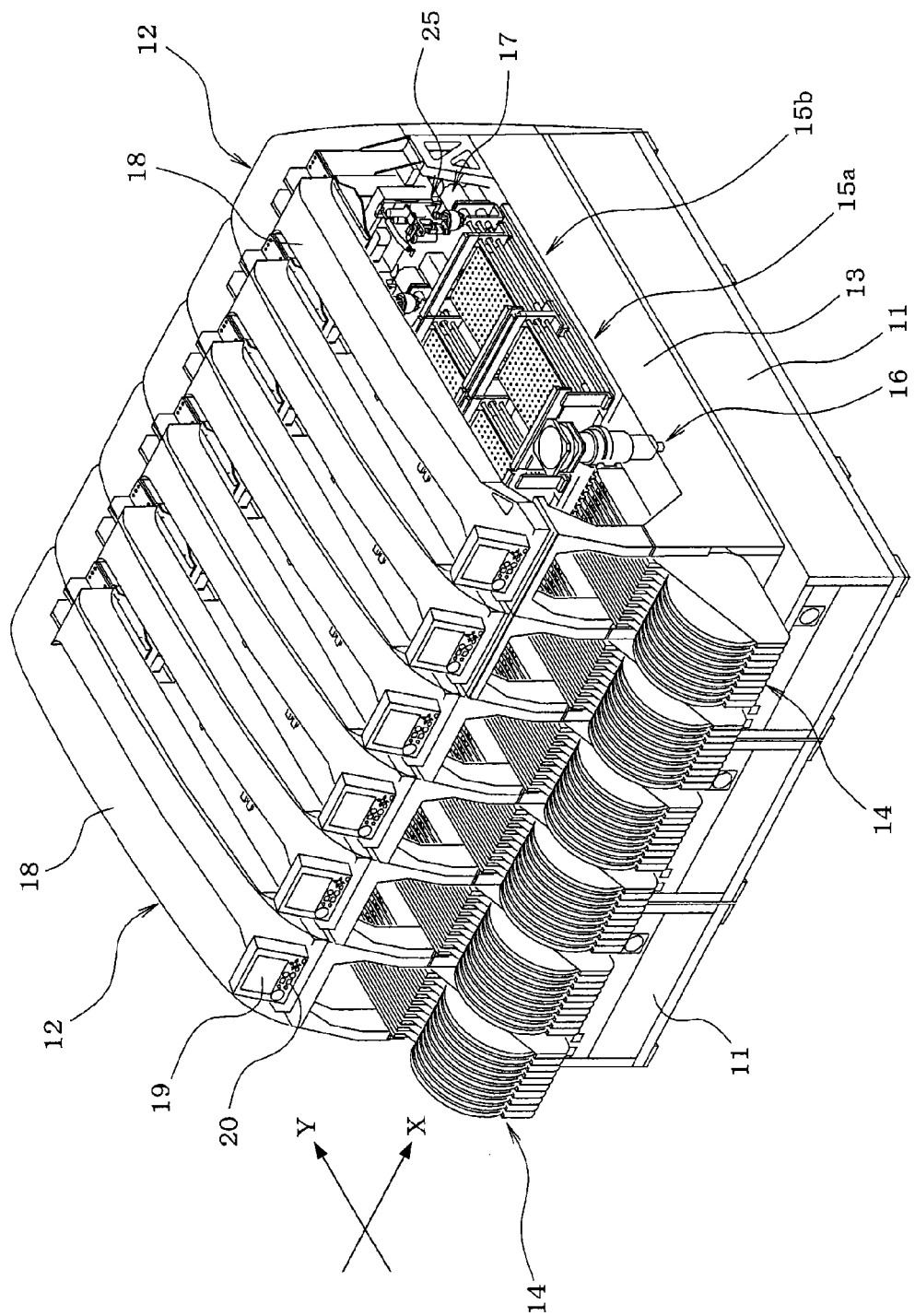

[Fig.2]
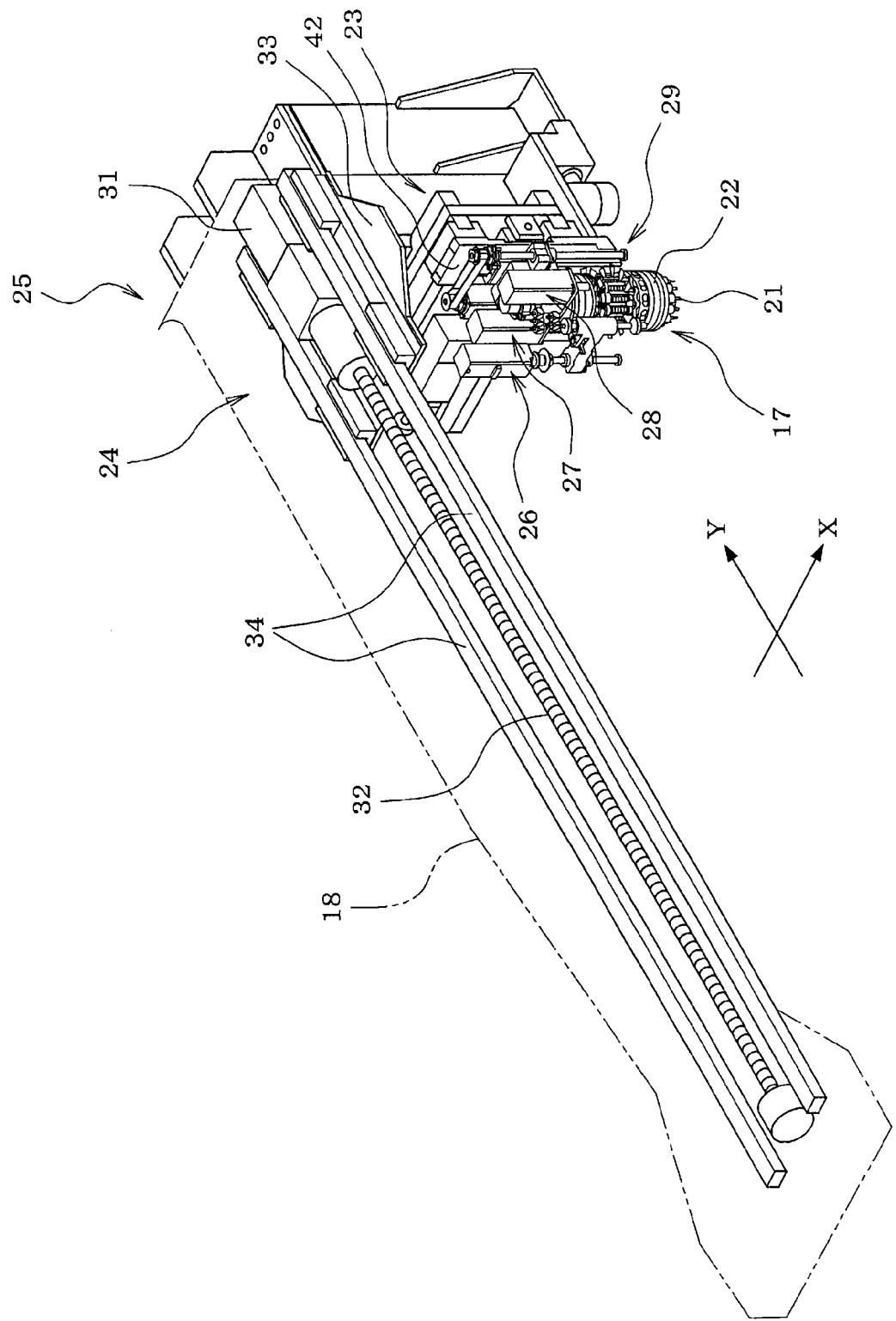

[Fig.3]
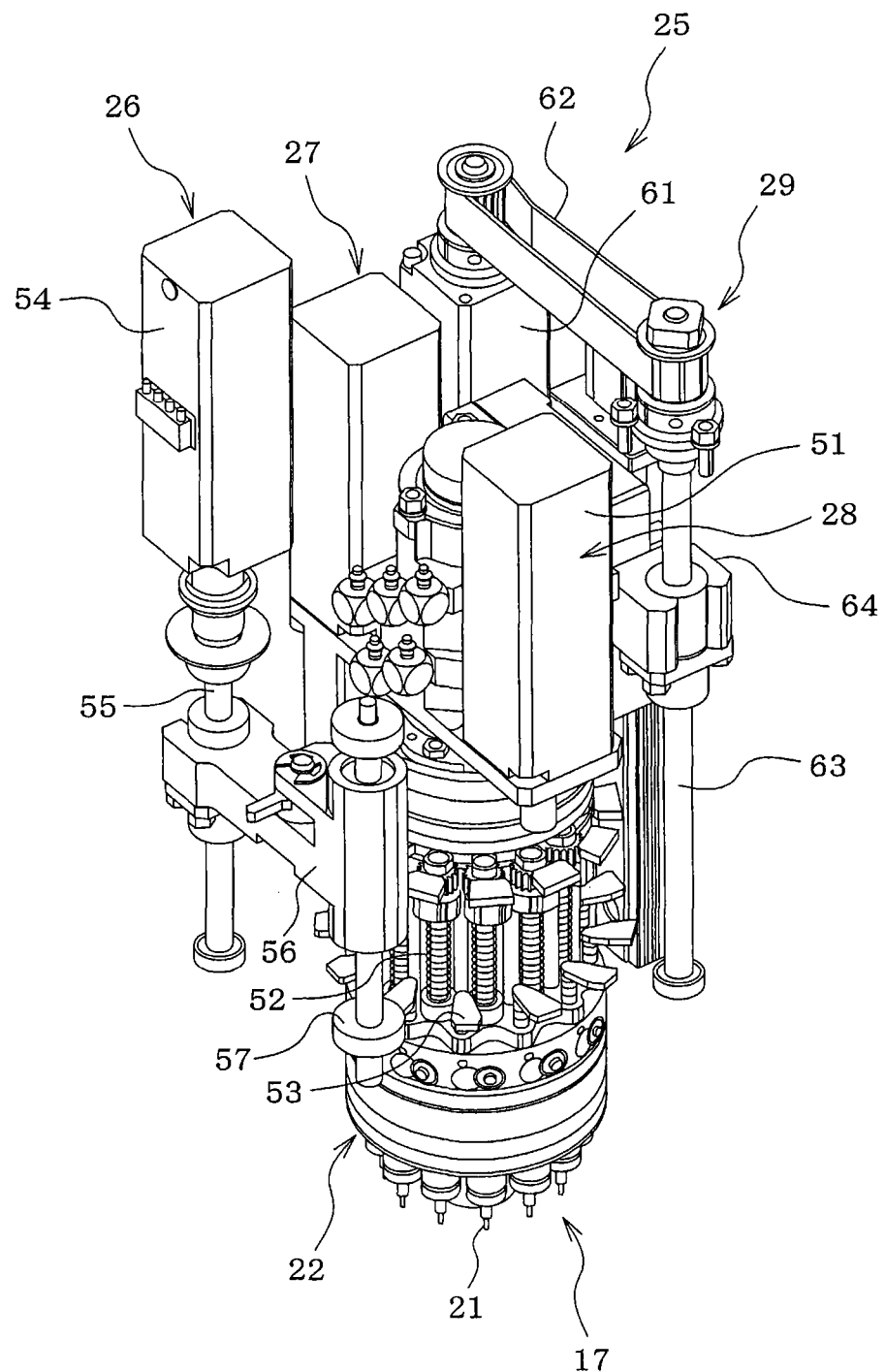

[Fig.4]
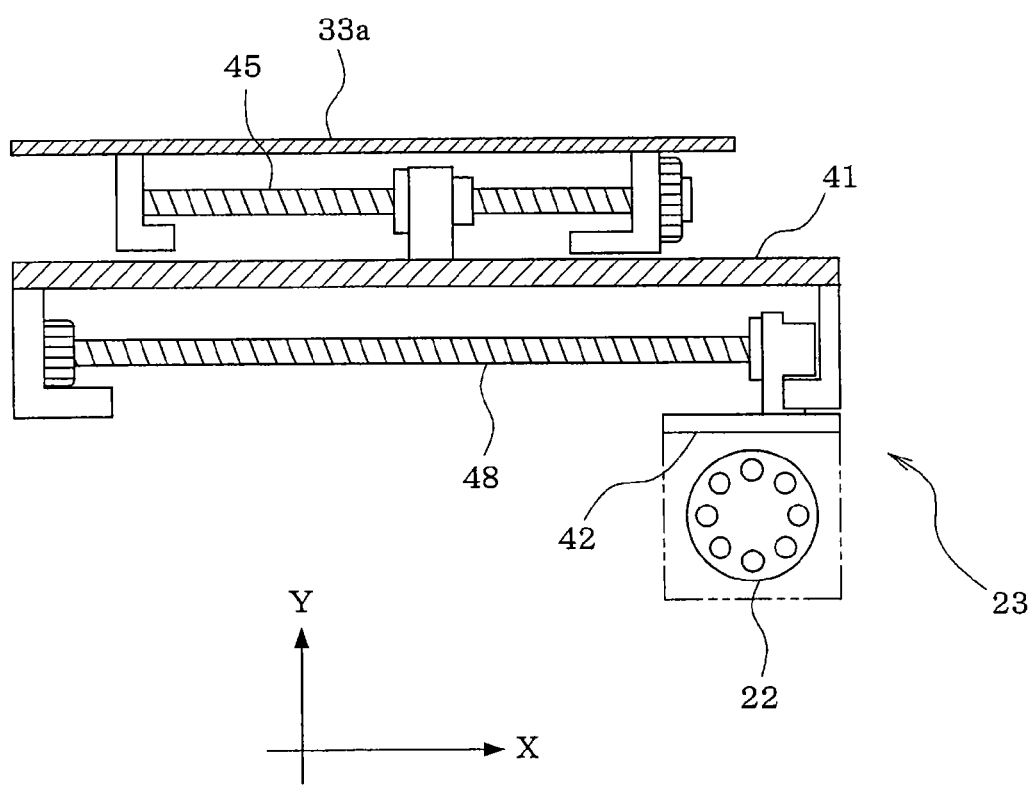

[Fig.5]
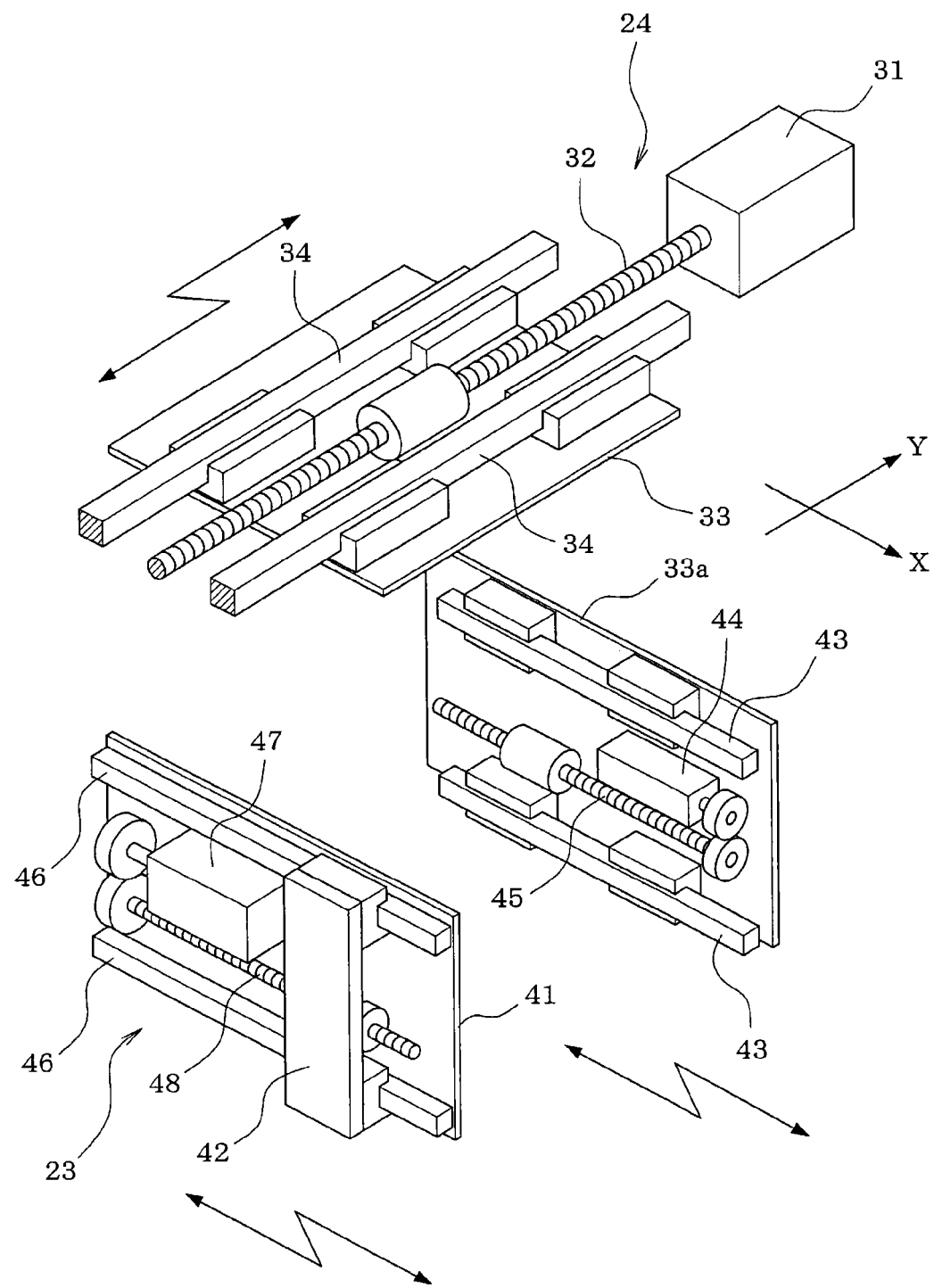

[Fig.6]
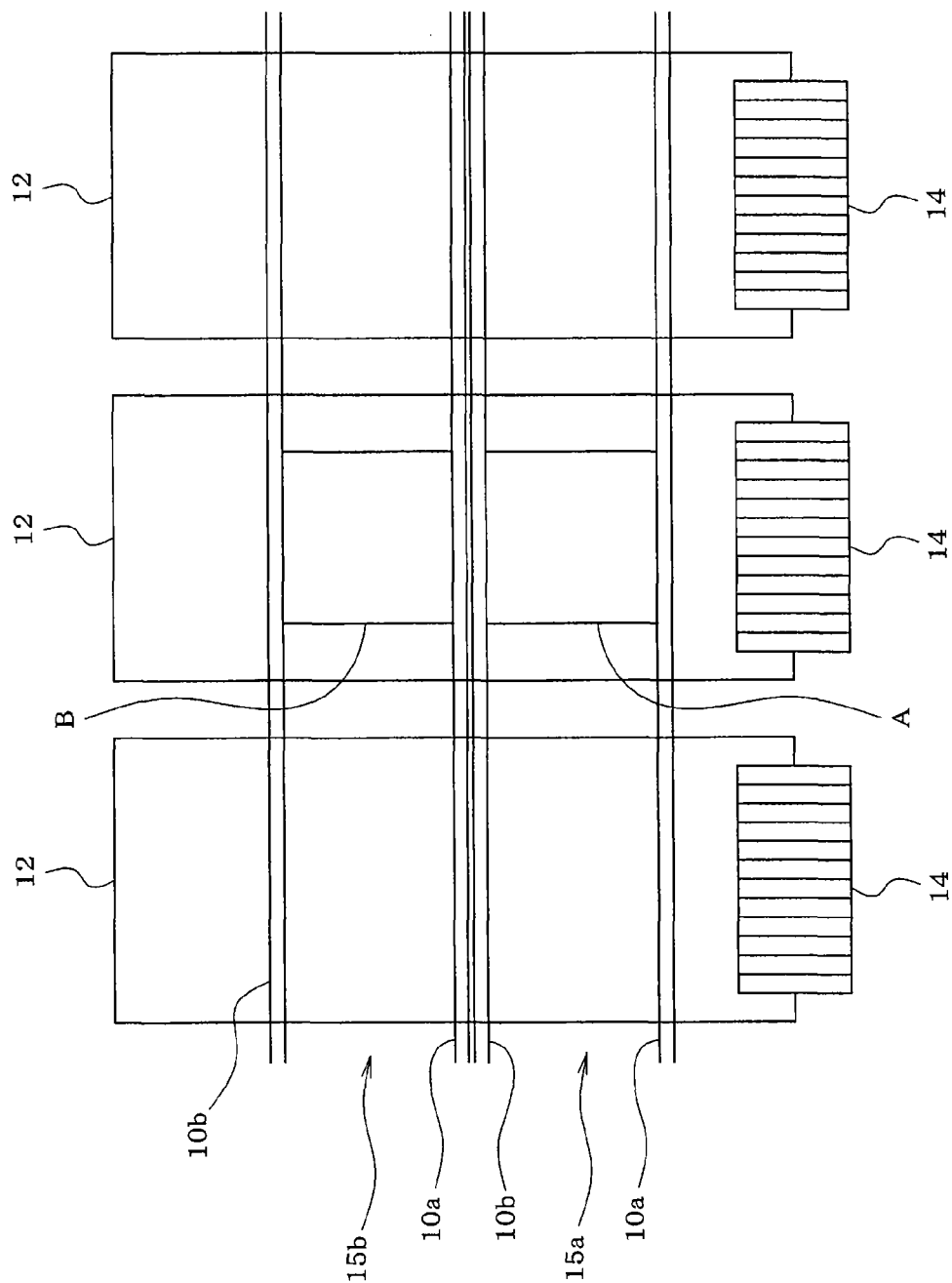

[Fig.7]
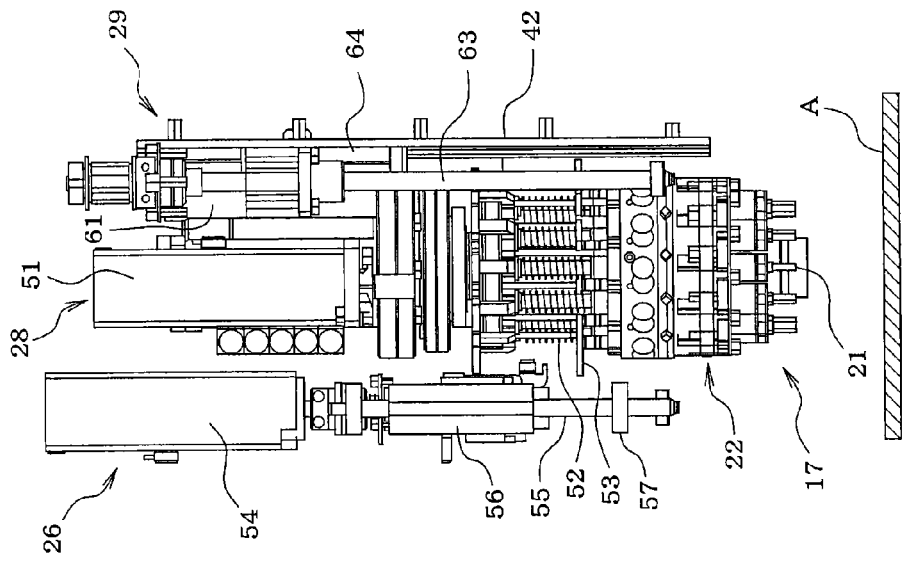
(b) HEIGHT POSITION WHEN MOUNTING HEAD IS LIFTED UP
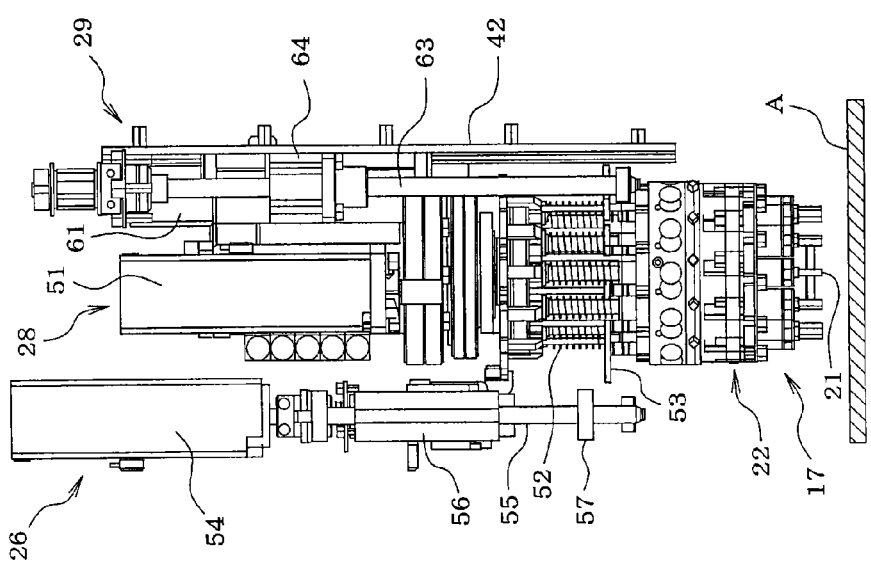
(a) NORMAL HEIGHT POSITION OF MOUNTING HEAD

[Fig.8]
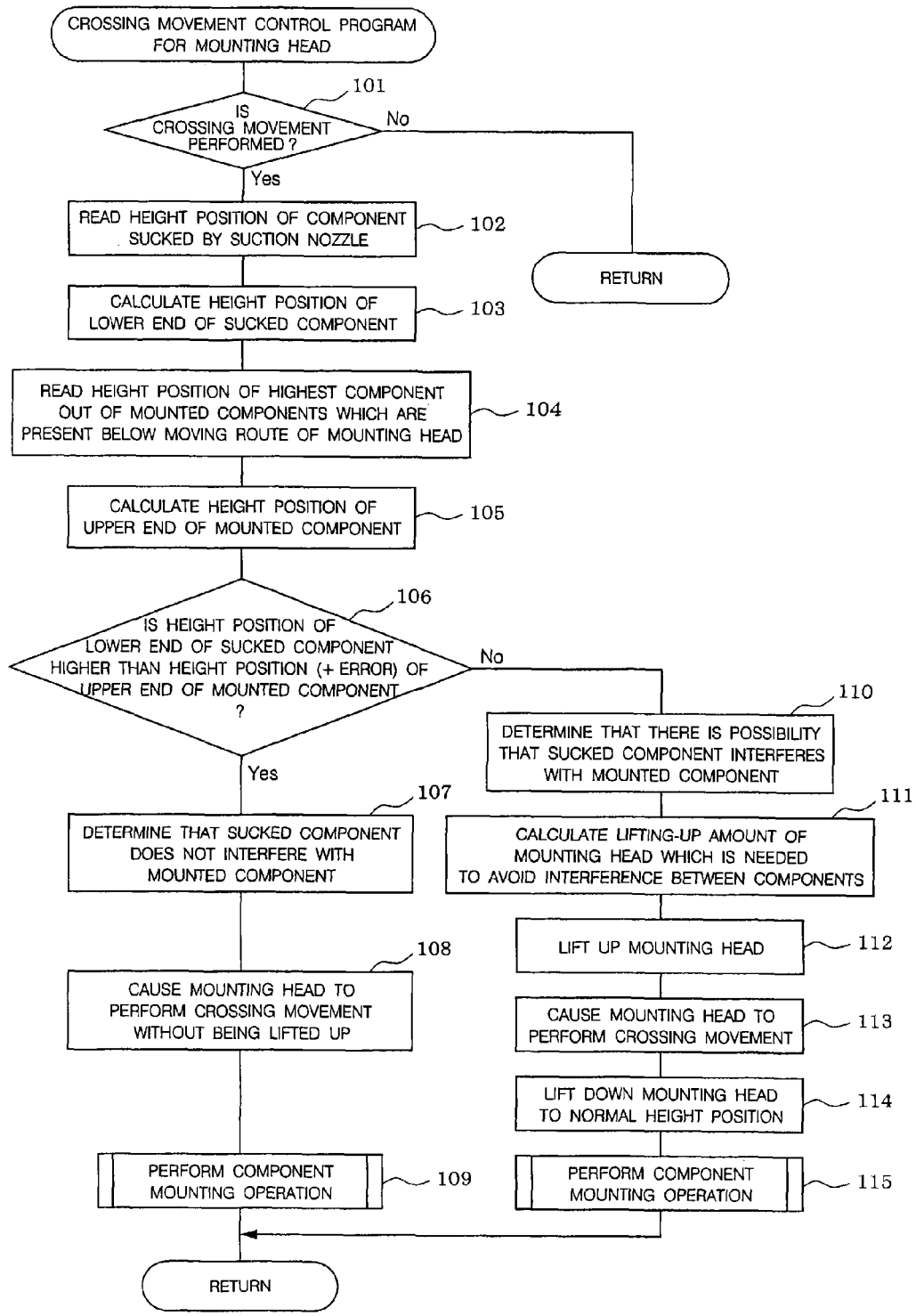

COMPONENT MOUNTING MACHINE

TECHNICAL FIELD

The present disclosure relates to a component mounting machine configured to individually lift up and down a plurality of suction nozzles held by a mounting head during component suction and component mounting.

BACKGROUND ART

In recent years, as disclosed in PTL 1 (JP-A-2008-311476), in a rotary-type component mounting machine, there are provided both a head rotating mechanism in which a plurality of suction nozzles is arrayed in a mounting head supported by an XY moving mechanism at predetermined intervals in a circumferential direction and which rotates the mounting head around a central axis thereof, and a nozzle lifting mechanism which individually lifts up and down the plurality of suction nozzles held by the mounting head during component suction and component mounting. In this rotary-type component mounting machine configured as described above, a lifting stroke of the suction nozzle is decreased to achieve a higher speed, and a height position of the suction nozzle when the suction nozzle is lifted up is set to be a position close to a circuit board.

CITATION LIST

Patent Literature

PTL 1: JP-A-2008-311476

SUMMARY OF INVENTION

Technical Problem

PTL 1, describes a component mounting machine in which two conveyors are disposed in parallel so as to be capable of transporting two circuit boards in parallel. In this configuration, when the mounting head is moved upward of a rear side conveyor across and over a front side (feeder side) conveyor after a component suction operation, it is necessary to arrange a component sucked by the suction nozzle so as not to interfere with a component mounted on the circuit board on the front side conveyor.

However, if the lifting stroke of the suction nozzle is increased and the height position at the time of the rise of the suction nozzle is increased in order to avoid the interference between the components, time for the lifting operation of the suction nozzle is prolonged during the component suction/mounting operation. Consequently, this method cannot cope with a demand for a higher speed during the component suction/mounting operation. On the other hand, if the lifting stroke of the suction nozzle is decreased and the height position at the time of the rise of the suction nozzle is decreased, when the height position of the component mounted on the circuit board on the front side conveyor is high, it is necessary to stop a movement of the mounting head and wait until the component mounted circuit board on the front side conveyor is transported outward, in order to avoid the interference with the mounted component. Accordingly, the productivity correspondingly decreases.

Therefore, the present disclosure provides a solution to a component mounting machine in which a plurality of conveyors is disposed in parallel so as to be capable of transporting a plurality of circuit boards in parallel, thereby enabling the component mounting machine to cope with a demand for a higher speed and improved productivity.

BRIEF SUMMARY OF THE INVENTION

Solution to Problem

In order to obtain the above-described solution, there is provided a component mounting machine including a mounting head that holds a plurality of suction nozzles, a plurality of conveyors that is disposed in parallel so as to be capable of transporting a plurality of circuit boards in parallel, a head driving device that moves the mounting head across the plurality of conveyors and mounts a component sucked by the suction nozzle on the circuit board which is transported by each conveyor, and a control device that controls the plurality of conveyors and the head driving device. The head driving device has a nozzle lifting mechanism which individually lifts up and lowers down the plurality of suction nozzles during component suction and component mounting, and an XY moving mechanism which moves the mounting head in XY directions. The head driving device has a head lifting mechanism which lifts up and lowers down the mounting head. When the control device causes the XY moving mechanism to move the mounting head across the plurality of conveyors after a component suction operation and it is determined that there is a possibility that the component sucked by the suction nozzle may interfere with the component mounted on the circuit board on any conveyor, the control device causes the head lifting mechanism to lift up the mounting head to a height position where the component sucked by the suction nozzle does not interfere with the mounted component. Thereafter, the control device causes the XY moving mechanism to move the mounting head upward of a target conveyor, and causes the head lifting mechanism to lower down the mounting head to an initial height position. Thereafter, the control device causes the nozzle lifting mechanism to lower down the suction nozzle and to mount the component on the circuit board on the conveyor.

In this configuration, in order to achieve a higher speed, a lifting stroke of the suction nozzle is decreased, the height position at the time of the rise of the suction nozzle is set to be a position close to the circuit board, and a component suction/mounting operation is performed. When the XY moving mechanism is caused to move the mounting head across the plurality of conveyors after the component suction operation, if it is determined that the component sucked by the suction nozzle does not interfere with the component mounted on the circuit board on any conveyor, the mounting head is not lifted up and is moved upward of a target conveyor, thereby mounting the component on the circuit board on the target conveyor. In contrast, when the mounting head is moved across the plurality of conveyors after the component suction operation, if it is determined that there is a possibility that the component sucked by the suction nozzle may interfere with the component mounted on the circuit board on any conveyor, the head lifting mechanism is caused to lift up the mounting head to a height position where the component sucked by the suction nozzle does not interfere with the mounted component. Thereafter, the XY moving mechanism is caused to move the mounting head upward of the target conveyor, and the head lifting mechanism is caused to lower down the mounting head to the initial position. Thereafter, the nozzle lifting mechanism is caused to lower down the suction nozzle, thereby mounting the component on the circuit board on the conveyor. According to this configuration, the lifting stroke of the suction nozzle is decreased, thereby satisfying a demand for a higher speed in the component suction/mounting operation. When the mounting head is moved across the plurality of conveyors after the component suction operation, it is possible to move the mounting head without waiting for the component mounted circuit board being transported outward, thereby allowing the improved productivity.

In this case, the mounting head may be a rotary-type mounting head in which the plurality of suction nozzles is arrayed at a predetermined interval in a circumferential direction and which has a lifting lever for respectively lifting-up and down each of the suction nozzles. The head driving device may have a head rotating mechanism which rotates the mounting head, and may be configured so that the nozzle lifting mechanism engages with the lifting lever to individually lift up and down the plurality of suction nozzles during a component suction operation and a component mounting operation. When causing the head lifting mechanism to lift up the mounting head, the control device may cause the head rotating mechanism to rotate the mounting head to move to a position where the lifting lever does not interfere with the nozzle lifting mechanism. Thereafter, the control device may cause the head lifting mechanism to lift up the mounting head. However, the present disclosure is not limited to the rotary-type mounting head, and may employ a configuration in which the plurality of suction nozzles is held by a mounting head which does not rotate.

In addition, the head lifting mechanism may include a ball screw mechanism which lifts up and down the mounting head, and a motor which drives the ball screw mechanism, and may be configured to be adjustable to a stepless height position of the mounting head. When causing the head lifting mechanism to lift up the mounting head, the control device may cause the head lifting mechanism to lift up the mounting head to the minimum height position where the component sucked by the suction nozzle does not interfere with the mounted component. If a lifting-up operation of the mounting head using the head lifting mechanism is limited to the minimum lifting-up amount needed to avoid the interference between the components, it is possible to minimize the prolonged time caused by the lifting-up operation of the mounting head. However, the present disclosure may be configured to be adjustable to a stepwise height position of the mounting head by the head lifting mechanism.

In addition, when causing the XY moving mechanism to move the mounting head across the plurality of conveyors after a component suction operation, the control device may determine whether or not there is a possibility that the component sucked by the suction nozzle may interfere with the component mounted on the circuit board on any conveyor, in view of a height position of the component sucked by the suction nozzle and a height position of the mounted component which is present below a moving route of the mounting head. According to this configuration, it is possible to accurately determine whether or not the component sucked by the suction nozzle interferes with the mounted component.

BRIEF DESCRIPTION OF DRAWINGS

FIG. 1 is a perspective view illustrating a configuration of a modularized component mounting system according to an embodiment of the present disclosure.

FIG. 2 is a perspective view illustrating an XY moving mechanism which moves a mounting head in an XY direction.

FIG. 3 is a perspective view illustrating a mounting head and a driving mechanism of each part.

FIG. 4 is a cross-sectional view illustrating a configuration of an X-axis slide mechanism.

FIG. 5 is a perspective view for describing a configuration of a Y-axis slide mechanism and an X-axis slide mechanism.

FIG. 6 is a plan view illustrating an installation state of two conveyors in a modularized component mounting system.

FIG. 7(a) is a front view of a main part which illustrates a normal height position of a mounting head, and FIG. 7(b) is a front view of the main part which illustrates a height position when a mounting head is lifted up.

FIG. 8 is a flowchart illustrating a process flow in a crossing movement control program for a mounting head.

DETAILED DESCRIPTION OF THE INVENTION

Description of Embodiments

Hereinafter, an embodiment of the present disclosure will be described with reference to the drawings.

First, a configuration of the modularized component mounting system will be described with reference to FIG. 1. A plurality of rotary head-type (revolver head-type) mounting machine modules 12 (component mounting machine) adjacent to each other in a transport direction of a circuit board is arranged side by side on a base table 11 of the modularized component mounting system so as to be replaceable. Each of the mounting machine modules 12 is configured so that a feeder 14 such as a tape feeder, conveyors 15a and 15b which transport circuit boards A and B (refer to FIG. 6), a component imaging device 16, and a component mounting device 17 are implemented on a main body bed 13. A display device 19 such as a liquid crystal display and a CRT, and an operation unit 20 such as an operation key are disposed in a front surface portion of an upper frame 18.

Each of the mounting machine modules 12 causes the conveyors 15a and 15b to transport the circuit board which is transported from the upstream side mounting machine module 12 to a predetermined mounting position, and causes a clamp mechanism (not illustrated) to clamp the circuit board so as to position the circuit board. Each of the mounting machine modules 12 causes a suction nozzle of a mounting head 17 to suck a component supplied by the feeder 14, thereby mounting the component on the circuit boards A and B on the conveyors 15a and 15b.

As illustrated in FIG. 6, in the modularized component mounting system according to the present embodiment, the plurality of (for example, two) conveyors 15a and 15b is disposed in parallel, and the respective conveyors 15a and 15b can transport the separate circuit boards A and B in parallel, respectively. Each of the conveyors 15a and 15b is configured to have board guides 10a and 10b which guide a transport direction of the circuit boards A and B, and a conveyor belt (not illustrated).

As illustrated in FIGS. 2 and 3, the component mounting device 17 is configured to have a mounting head 22 which holds a plurality of suction nozzles 21 so as to be replaceable, and a head driving device 25 which moves the mounting head 22. The mounting head 22 is a rotary-type mounting head in which the plurality of suction nozzles 21 is arrayed at a predetermined interval in a circumferential direction.

The head driving device 25 is configured to have an X-axis slide mechanism 23 which moves the mounting head 22 in a transport direction of the circuit boards A and B (hereinafter, this direction is defined as an "X direction"), a Y-axis slide mechanism 24 which moves the X-axis slide mechanism 23 together with the mounting head 22 in a Y direction (direction orthogonal to the transport direction of the circuit boards A and B), a nozzle lifting mechanism 26 (first Z-axis lifting mechanism) which individually lifts up and down the plurality of suction nozzles 21 of the mounting head 22 during a component suction operation or a component mounting operation, a nozzle rotating mechanism 27 (θ-axis rotating mechanism) which rotates the suction nozzle 21 around a central axis thereof (θ-axis), a head rotating mechanism 28 (R-axis rotating mechanism) which rotates the mounting head 22 around a central axis thereof (R-axis), and a head lifting mechanism 29 (second Z-axis lifting mechanism) which lifts up and down the mounting head 22.

The Y-axis slide mechanism 24 causes a Y-axis motor 31 attached to the upper frame 18 side of the mounting machine module 12 to rotatably drive a Y-axis ball screw 32. In this manner, the Y-axis slide mechanism 24 is configured so as to cause a Y-axis slide 33 to slide along a Y-axis guide 34 in a Y direction (refer to FIG. 5).

In contrast, as illustrated in FIGS. 4 and 5, the X-axis slide mechanism 23 is a two-stage-type slide mechanism in which two X-axis slides 41 and 42 are combined with each other. A first guide 43 which guides the first X-axis slide 41 in an X direction and a first X-axis motor 44 are attached to a support plate 33a vertically fixed to the Y-axis slide 33, and the first X-axis motor 44 is caused to rotatably drive a first X-axis ball screw 45. In this manner, the X-axis slide mechanism 23 is configured so as to cause the first X-axis slide 41 to slide along the first guide 43 in the X direction. Then, a second guide 46 which guides the second X-axis slide 42 in the X direction and a second X-axis motor 47 are attached to the first X-axis slide 41, and the second X-axis motor 47 is caused to rotatably drive a second X-axis ball screw 48. In this manner, the X-axis slide mechanism 23 is configured so as to cause the second X-axis slide 42 to slide along the second guide 46 in the X direction. An XY moving mechanism which moves the mounting head 22 in XY directions (X direction and Y direction) is configured to have the X-axis slide mechanism 23 and the Y-axis slide mechanism 24.

The mounting head 22 is assembled to the second X-axis slide 42 via the head lifting mechanism 29. A head rotating motor 51 which is a driving source of the head rotating mechanism 28 is configured to cause the mounting head 22 to intermittently rotate around a central axis of the mounting head 22 at each array pitch angle of the suction nozzles 21. A plurality of nozzle holders 52 which holds the suction nozzle 21 is assembled to the mounting head 22 so as to be vertically movable. Each of the nozzle holders 52 is biased upward by a spring or the like. In this manner, each of the suction nozzles 21 is held at an upper limit position of the lifting stroke thereof.

As illustrated in FIG. 3, a lifting lever 53 for respectively lifting up and down each of the nozzle holders 52 is disposed in the mounting head 22. The nozzle lifting mechanism 26 is configured to have a first Z-axis ball screw 55 which is rotatably driven by a nozzle lifting motor 54 (first Z-axis motor), a first Z-axis slide 56 which is moved in a vertical direction (Z direction) by the first Z-axis ball screw 55, and an engaging member 57 which is attached to the first Z-axis slide 56. During the component suction/mounting operation, the engaging member 57 engages with the lifting lever 53 of one nozzle holder 52 located at a predetermined component suction/mounting station, and presses the lifting lever 53 downward. In this manner, the nozzle holder 52 and the suction nozzle 21 are lowered down to a lower limit position of the lifting stroke against a resilient force of a spring or the like. Thereafter, if the first Z-axis slide 56 is lifted up and the engaging member 57 is lifted up, the nozzle holder 52 and the suction nozzle 21 are lifted up to an upper limit position of the lifting stroke by the resilient force of the spring or the like in response to the lifting-up of the engaging member 57.

The head lifting mechanism 29 is configured to have a second Z-axis ball screw 63 which is rotatably driven by a belt 62 driven by a head lifting motor 61 (second Z-axis motor), and a second Z-axis slide 64 which is moved in the vertical direction (Z direction) by the second Z-axis ball screw 63. The mounting head 22 is attached to the second Z-axis slide 64. This controls a rotation amount of the head lifting motor 61, thereby providing a configuration where it is adjustable to a stepless height position of the mounting head 22. When the mounting head 22 is lifted up by the head lifting mechanism 29, the head rotating mechanism 28 rotates the mounting head 22 to move to a position where the lifting lever 53 does not interfere with the engaging member 57 of the nozzle lifting mechanism 29. Thereafter, the head lifting mechanism 29 lifts up the mounting head 22. A portion supporting the head lifting motor 61, the second Z-axis ball screw 63, the nozzle lifting motor 54 and the first Z-axis ball screw 55 of the head lifting mechanism 29 is supported by the second X-axis slide 42.

Each motor for driving the above-described head driving device 25 (X-axis slide mechanism 23, Y-axis slide mechanism 24, nozzle lifting mechanism 26, nozzle rotating mechanism 27, head rotating mechanism 28, and head lifting mechanism 29) is controlled by a control device (computer) of the mounting machine module 12.

During the operation of the mounting machine module 12, each time the suction nozzle 21 sucks the component supplied from the feeder 14, the mounting head 22 is pitch-driven by an array pitch angle of the suction nozzles 21 in the rotating direction. Then, the next suction nozzle 21 sucks the component supplied from the feeder 14. These operations are repeated, and the plurality of suction nozzles 21 respectively sucks the component. Thereafter, the mounting head 22 is moved upward of the circuit board. In this manner, a component-mounted board is produced by alternately repeating the component mounting on the circuit board and the pitch driving of the mounting head 22.

As illustrated in FIG. 6, in a configuration having double conveyors (dual lanes) in which two conveyors 15a and 15b are disposed in parallel, when the mounting head 22 is moved upward of the rear side conveyor 15b from the feeder 14 side over and across the front side conveyor 15a after a component suction operation, it is necessary that the component sucked by the suction nozzle 21 does not interfere with the component mounted on the circuit board A on the front side conveyor 15a.

However, if the lifting stroke of the suction nozzle 21 is increased and the height position at the time of the rise of the suction nozzle 21 is increased in order to avoid the interference between the components, time for the lifting operation of the suction nozzle 21 is prolonged during the component suction/mounting operation. Consequently, this method cannot cope with a demand for a higher speed during the component suction/mounting operation. On the other hand, if the lifting stroke of the suction nozzle 21 is decreased and the height position at the time of the rise of the suction nozzle is decreased, when the height position of the component mounted on the circuit board A on the front side conveyor 15a is high, the height position of the mounting head 22 (suction nozzle 21) is not changed. Then, if these are moved upward of the rear side conveyor 15b, the component sucked by the suction nozzle 21 interferes with the component mounted on the circuit board A on the front side conveyor 15a.

Therefore, in the present embodiment, the control device of the mounting machine module 12 executes a crossing movement control program for the mounting head in FIG. 8. In this manner, when the mounting head 22 is moved upward of the rear side conveyor 15b from the feeder 14 side over and across the front side conveyor 15a after the component suction operation, the control device determines whether or not there is a possibility that the component sucked by the suction nozzle 21 may interfere with the component mounted on the circuit board A on the front side conveyor 15a, in view of the height position of the component sucked by the suction nozzle 21 and the height position of the mounted component which is present below a moving route of the mounting head 22. When the control device determines that there is the possibility that the component sucked by the suction nozzle 21 interferes with the component mounted on the circuit board A on the front side conveyor 15a, as illustrated in FIG. 7(b), the control device causes the head lifting mechanism 29 to lift up the mounting head 22 to a position where the component sucked by the suction nozzle 21 does not interfere with the mounted component. Thereafter, the control device causes the X-axis slide mechanism 23 and the Y-axis slide mechanism 24 to move the mounting head 22 upward of the rear side conveyor 15b, and causes the head lifting mechanism 29 to lower down the mounting head 22 to the initial height position. Thereafter, the control device causes the nozzle lifting mechanism 26 to lower down the suction nozzle 21, thereby mounting the component on the circuit board B on the rear side conveyor 15.

In contrast, when the control device determines that the component sucked by the suction nozzle 21 does not interfere with the mounted component on the circuit board A on the front side conveyor 15a, the mounting head 22 is not lifted up, and is moved upward of the rear side conveyor 15b, thereby mounting the component on the circuit board B on the rear side conveyor 15b. Hereinafter, processing content in the crossing movement control program for the mounting head in FIG. 8 will be described.

The crossing movement control program for the mounting head in FIG. 8 is repeatedly executed at predetermined cycles during the operation of the mounting machine module 12 by the control device of the mounting machine module 12. When this program is started, in Step 101, the control device first determines whether or not to perform a "crossing movement" for moving the mounting head 22 upward of the rear side conveyor 15b from the feeder 14 side over and across the front side conveyor 15a after the component suction operation. If the control device determines that the crossing movement is not performed, the control device immediately completes this program without performing the subsequent processes.

In contrast, in Step 101 described above, if the control device determines that the crossing movement is performed, the process proceeds to Step 102. In order to acquire the height position of the component sucked by the suction nozzle 21 of the mounting head 22, the control device retrieves and reads data relating to the height position of the corresponding component from a component database stored in a storage device (not illustrated). At this time, when the height positions of multiple components sucked by the plurality of suction nozzles 21 of the mounting head 22 are different from one another, the control device may read the height position of the highest component.

Thereafter, the process proceeds to Step 103. The control device calculates the height position of a lower end of the component sucked by the suction nozzle 21 by using the height position of the component which is read in Step 102 described above. At this time, the height position of the mounting head 22 is a normal height position (height position during the component suction/mounting operation) illustrated in FIG. 7(a).

In subsequent Step 104, out of the components mounted on the circuit board A which are present below the moving route of the mounting head 22, the control device retrieves and reads the height position of the highest component from the component database. Thereafter, the process proceeds to Step 105.

The control device calculates the height position of an upper end of the component mounted on the circuit board A by using the height position of the mounted component which is read in Step 104 described above.

Thereafter, the process proceeds to Step 106. Based on whether or not the height position of the lower end of the component sucked by the suction nozzle 21 is higher than the height position (+error) of the upper end of the component mounted on the circuit board A, the control device determines whether or not there is a possibility that the component sucked by the suction nozzle 21 may interfere with the component mounted on the circuit board A during the crossing movement. At this time, the control device considers that an error occurs in the height position due to vibrations of the XY-axis slide mechanisms 23 and 24 during the crossing movement or variations in the mounting height of the component mounted on the circuit board A. In this manner, based on whether or not the height position of the lower end of the component sucked by the suction nozzle 21 is higher than "the height position of the upper end of the mounted component+the error", the control device may determine whether or not there is the possibility that the component sucked by the suction nozzle 21 interferes with the component mounted on the circuit board A during the crossing movement.

In Step 106, if the control device determines that the height position of the lower end of the component sucked by the suction nozzle 21 is higher than the height position (+the error) of the upper end of the component mounted on the circuit board A, the process proceeds to Step 107. The control device determines that the component sucked by the suction nozzle 21 does not interfere with the component mounted on the circuit board A. In this case, the process proceeds to Step 108. The mounting head 22 is not lifted up, and is caused to perform the crossing movement upward of the rear side conveyor 15b while staying in the normal height position. Thereafter, the process proceeds to Step 109, thereby mounting the component on the circuit board B on the rear side conveyor 15b.

In contrast, in Step 106 described above, if the control device determines that the height position of the lower end of the component sucked by the suction nozzle 21 is equal to or lower than the height position (+the error) of the upper end of the component mounted on the circuit board A, the process proceeds to Step 110. The control device determines that there is the possibility that the component sucked by the suction nozzle 21 interferes with the component mounted on the circuit board A. In this case, the process proceeds to Step 111. The control device calculates the minimum lifting-up amount of the mounting head 22 which is needed to avoid the interference between the components.

The lifting-up amount of the mounting head 22=[the height position of the upper end of the mounted component+ the error]−[the height position of the lower end of the sucked component].

Thereafter, the process proceeds to Step 112. The control device causes the head lifting mechanism 29 to lift up the mounting head 22 by the lifting-up amount calculated in Step 111 described above (by the minimum lifting-up amount which is needed to avoid the interference between the components).

Thereafter, the process proceeds to Step 113. After the mounting head 22 is caused to perform the crossing movement upward of the rear side conveyor 15b, the process proceeds to Step 114. The control device causes the head lifting mechanism 29 to lower down the mounting head 22 to the normal height position illustrated in FIG. 7(a). Thereafter, the process proceeds to Step 115, thereby mounting the component on the circuit board B on the rear side conveyor 15b.

According to the present embodiment described above, in order to achieve a higher speed, the lifting stroke of the suction nozzle 21 is decreased, the height position when the suction nozzle 21 is lifted up is set to be the position close to the circuit board A on the front side conveyor 15a, and the component suction/mounting operation is performed. When the mounting head 22 is caused to perform the crossing movement upward of the rear side conveyor 15b after the component suction operation, the control device determines whether or not there is the possibility that the component sucked by the suction nozzle 21 may interfere with the component mounted on the circuit board A on the front side conveyor 15a. When the control device determines that there is the possibility that the component sucked by the suction nozzle 21 interferes with the mounted component, the control device causes the head lifting mechanism 29 to lift up the mounting head 22 to the height position where the component sucked by the suction nozzle 21 does not interfere with the mounted component. Then, the control device causes the mounting head 22 to perform the crossing movement upward of the rear side conveyor 15b, and causes the head lifting mechanism 29 to lower down the mounting head 22 to the initial height position. Thereafter, the control device causes the component to be mounted on the circuit board B on the rear side conveyor 15. In contrast, when the mounting head 22 is caused to perform the crossing movement upward of the rear side conveyor 15b after the component suction operation, if the control device determines that the component sucked by the suction nozzle 21 does not interfere with the mounted component, the mounting head 22 is not lifted up and is moved upward of the rear side conveyor 15b, thereby mounting the component on the circuit board B on the rear side conveyor 15b. According to this configuration, the lifting stroke of the suction nozzle 21 is decreased, thereby satisfying a demand for the higher speed in the component suction/mounting operation. When the mounting head 22 is caused to perform the crossing movement upward of the rear side conveyor 15b after the component suction operation, it is possible to cause the mounting head 22 to perform the crossing movement upward of the rear side conveyor 15b without waiting for the component mounted circuit board A being transported outward, thereby allowing the improved productivity.

In addition, in the present embodiment, the head lifting mechanism 29 is configured to be adjustable to a stepless height position of the mounting head 22. Therefore, the lifting-up operation of the mounting head 22 using the head lifting mechanism 29 can be limited to the minimum lifting-up amount which is needed to avoid the interference between the components. Thus, it is possible to minimize the prolonged time caused by the lifting-up operation of the mounting head 22.

However, an embodiment of the present disclosure may be configured to be adjustable to a stepwise height position of the mounting head 22 by the head lifting mechanism 29.

In addition, without being limited to the rotary-type mounting head, an embodiment of the present disclosure may have a configuration in which the plurality of suction nozzles is held by the mounting head which does not rotate.

In addition, the present disclosure can also be applied to a configuration in which three or more conveyors are disposed in parallel, or the configuration of the head driving device 25 which moves the mounting head 22 may be appropriately modified. The present disclosure may be embodied by various modifications within the scope without departing from the spirit of the present disclosure.

REFERENCE SIGNS LIST 11 base table, 12 mounting machine module (component mounting machine), 14 feeder, 15a, 15b conveyor, 16 component imaging device, 17 component mounting device, 21 suction nozzle, 22 mounting head, 23 X-axis slide mechanism (XY moving mechanism), 24 Y-axis slide mechanism (XY moving mechanism), 25 head driving device, 26 nozzle lifting mechanism, 27 nozzle rotating mechanism, 28 head rotating mechanism, 29 head lifting mechanism, 31 Y-axis motor, 33 Y-axis slide, 41 first X-axis slide, 42 second X-axis slide, 44 first X-axis motor, 47 second X-axis motor, 51 head rotating motor, 52 nozzle holder, 53 lifting lever, 54 nozzle lifting motor, 55 first Z-axis ball screw, 56 first Z-axis slide, 57 engaging member, 61 head lifting motor, 63 second Z-axis ball screw, 64 second Z-axis slide

The invention claimed is:
1. A component mounting machine comprising:
a mounting head that holds a plurality of suction nozzles;
a plurality of conveyors disposed in parallel to transport a plurality of circuit boards in parallel;
a head driving device that moves the mounting head across the plurality of conveyors and mounts a component sucked by a suction nozzle of the plurality of suction nozzles on to the circuit boards transported by each conveyor; and
a control device that controls the plurality of conveyors and the head driving device,
wherein the head driving device has a nozzle lifting mechanism which individually lifts up and down the plurality of suction nozzles during component suction and component mounting, and an XY moving mechanism which moves the mounting head in an XY direction,
wherein the head driving device has a head lifting mechanism which lifts up and down the mounting head,
wherein when the control device causes the XY moving mechanism to move the mounting head in an initial height position across the plurality of conveyors after a component suction operation and the control devices determines that a height position of a lower end of the component sucked by one of said suction nozzles in the initial height position interferes with a mounted component on a circuit board on any of the plurality of conveyors, the control device causes the head lifting mechanism to lift up the mounting head to a height position where the height position of the lower end of the component sucked by the suction nozzle does not interfere with the mounted component, wherein thereafter, the control device causes the XY moving mechanism to move the mounting head upward of a target conveyor, and causes the head lifting mechanism to lower down the mounting head to the initial height position, and wherein thereafter, the control device causes the nozzle lifting mechanism to lower down the suction nozzle and to mount the component on the circuit board on the conveyor.

2. The component mounting machine according to claim 1, wherein the mounting head is a rotary-type mounting head in which the plurality of suction nozzles is arrayed at a predetermined interval in a circumferential direction of the mounting head and which has a lifting lever for respectively lifting-up and down each of the suction nozzles, wherein the head driving device has a head rotating mechanism which rotates the mounting head, and the nozzle lifting mechanism engages with the lifting lever to individually lift up and down the plurality of suction nozzles during the component suction operation and a component mounting operation, and wherein when causing the head lifting mechanism to lift up the mounting head, the control device causes the head rotating mechanism to rotate the mounting head to move to a position where the lifting lever does not interfere with the nozzle lifting mechanism, and thereafter, the control device causes the head lifting mechanism to lift up the mounting head.

3. The component mounting machine according to claim 1, wherein the head lifting mechanism includes a ball screw mechanism which lifts up and lowers down the mounting head, and a motor which drives the ball screw mechanism, and the head lifting mechanism steplessly adjusts the height position of the mounting head, and wherein when causing the head lifting mechanism to lift up the mounting head, the control device causes the head lifting mechanism to lift up the mounting head to the initial height position where the component sucked by the suction nozzle does not interfere with the mounted component.

4. The component mounting machine according to claim 1, wherein when causing the XY moving mechanism to move the mounting head across the plurality of conveyors after the component suction operation, the control device determines whether or not the height position of the lower end of the component sucked by the suction nozzle interferes with the component mounted on the circuit board on any conveyor based on a height position of the component sucked by the suction nozzle and a height position of the mounted component present below a moving route of the mounting head.

5. The component mounting machine according to claim 2, wherein the head lifting mechanism includes a ball screw mechanism which lifts up and lowers down the mounting head, and a motor which drives the ball screw mechanism, and the head lifting mechanism steplessly adjusts the height position of the mounting head, and wherein when causing the head lifting mechanism to lift up the mounting head, the control device causes the head lifting mechanism to lift up the mounting head to the minimum height position where the component sucked by the suction nozzle does not interfere with the mounted component.

6. The component mounting machine according to claim 2, wherein when causing the XY moving mechanism to move the mounting head across the plurality of conveyors after the component suction operation, the control device determines whether or not the component sucked by the suction nozzle may interfere with the component mounted on the circuit board on any conveyor based on a height position of the component sucked by the suction nozzle and a height position of the mounted component present below a moving route of the mounting head.

7. The component mounting machine according to claim 3, wherein when causing the XY moving mechanism to move the mounting head across the plurality of conveyors after the component suction operation, the control device determines whether or not the height position of the lower end of the component sucked by the suction nozzle interferes with the component mounted on the circuit board on any conveyor based on a height position of the component sucked by the suction nozzle and a height position of the mounted component present below a moving route of the mounting head.

8. A component mounting machine comprising:

a mounting head that holds a plurality of suction nozzles;

a plurality of conveyors disposed in parallel to transport a plurality of circuit boards in parallel;

a head driving device that moves the mounting head across the plurality of conveyors and mounts a component sucked by a suction nozzle of the plurality of suction nozzles on to the circuit boards transported by each conveyor, the head driving device including nozzle lifting mechanism which individually lifts up and down the plurality of suction nozzles during component suction and component mounting, an XY moving mechanism which moves the mounting head in an XY direction, and a head lifting mechanism which lifts up and down the mounting head; and means for controlling the plurality of conveyors and the head driving device, so that when the XY moving mechanism moves the mounting head in an initial height position across the plurality of conveyors after a component suction operation and it is determined that height position of a lower end of the component sucked by one of said suction nozzle in the initial height position interferes with a mounted component on a circuit board on any of the plurality of conveyors, the head lifting mechanism lifts up the mounting head to a height position where the height position of the lower end of the component sucked by the suction nozzle does not interfere with the mounted component, thereafter, the XY moving mechanism moves the mounting head upward of a target conveyor, and the head lifting mechanism lowers down the mounting head to the initial height position, and thereafter, the nozzle lifting mechanism lowers down the suction nozzle and to mount the component on the circuit board on the conveyor.

* * * * *